United States Patent [19]
Quick

[11] Patent Number: 5,391,841
[45] Date of Patent: Feb. 21, 1995

[54] LASER PROCESSED COATINGS ON ELECTRONIC CIRCUIT SUBSTRATES

[76] Inventor: Nathaniel R. Quick, 425 Manhattan Dr., Boulder, Colo. 80303

[21] Appl. No.: 987,017

[22] Filed: Dec. 8, 1992

[51] Int. Cl.[6] .............................................. H05K 1/03
[52] U.S. Cl. ...................................... 174/258; 361/750
[58] Field of Search ............... 174/250, 258, 254, 255; 361/750

[56] References Cited

U.S. PATENT DOCUMENTS

| | | | |
|---|---|---|---|
| 3,874,240 | 4/1975 | Rembaum | 73/356 |
| 4,620,264 | 10/1986 | Ushifusa et al. | 361/414 |
| 4,624,934 | 11/1986 | Kokubu et al. | 501/17 |
| 4,791,239 | 12/1988 | Shirahata et al. | 174/68.5 |
| 4,860,442 | 8/1989 | Ainsworth et al. | 29/830 X |
| 4,924,033 | 5/1990 | Iyogi et al. | 174/259 |
| 5,055,967 | 10/1991 | Sukonnik et al. | 361/387 |
| 5,180,440 | 1/1993 | Siegel et al. | 136/230 |

*Primary Examiner*—Leo P. Picard
*Assistant Examiner*—L. Thomas
*Attorney, Agent, or Firm*—Clay Holland, Jr.

[57] ABSTRACT

Enhanced thermal and electrical properties of ceramic for high-power integrating substrates are provided by focused thermal energy sources such as by laser processing. A thin ceramic layer, such as alumina, is plasma spray deposited on a relative thick metal substrate, such as copper or alloy thereof, as a heat sink for improved dielectric and thermal properties which are produced by laser-reflow and recrystallization so as to convert and provide a different ceramic of higher dielectric and denser structure. Laser-reflow and recrystallization causes a purification or purging and conversion process that vaporizes deleterious impurities and changes the crystalline structure while densifying the resulting structure of the ceramic layer. After conversion of the ceramic layer a metal coating may be plasma spray deposited thereon and electrical circuit elements and wiring patterns may be formed thereon by laser etching for high power applications, such as heat-sinks, electronic control modules, or heating panels. As another aspect, ceramic coated metal substrates with recesses or cavities formed therein contiguous with its surfaces, may be laser-reflow processed for containing microelectronic circuit chips and devices in multilayer chip module (MCM) applications. Alternatively, ceramic substrates with cavities formed in the surfaces thereof may be laser-reflow processed for such multilayer applications.

16 Claims, 2 Drawing Sheets

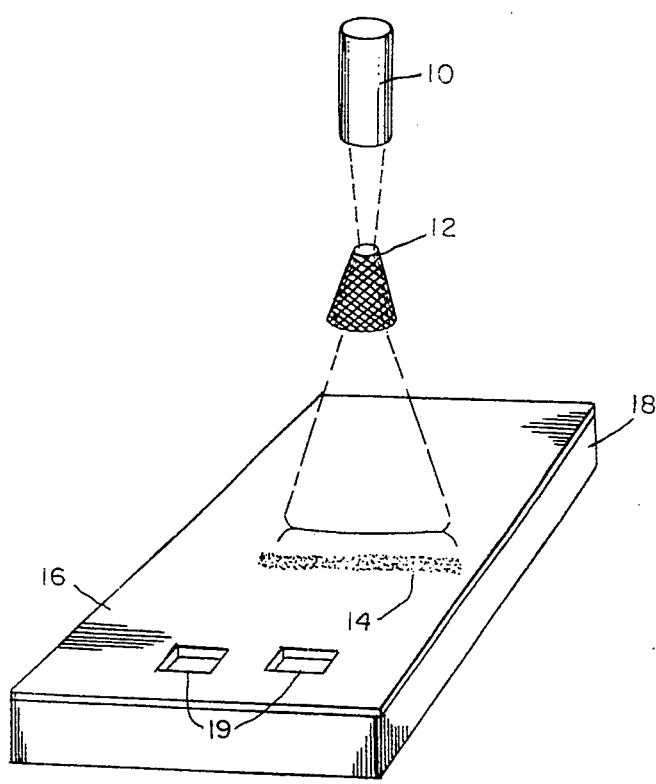
FIG. 1
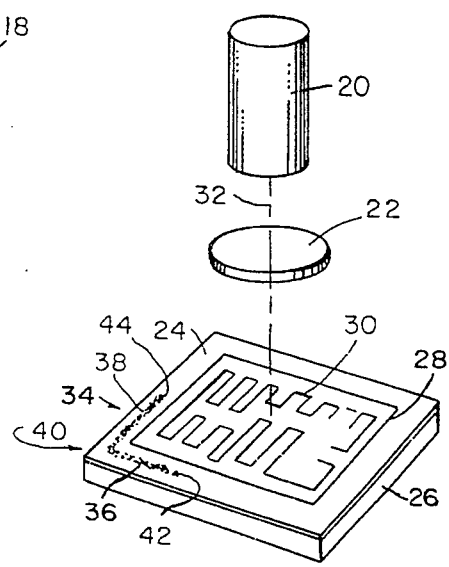
FIG. 2
FIG. 3
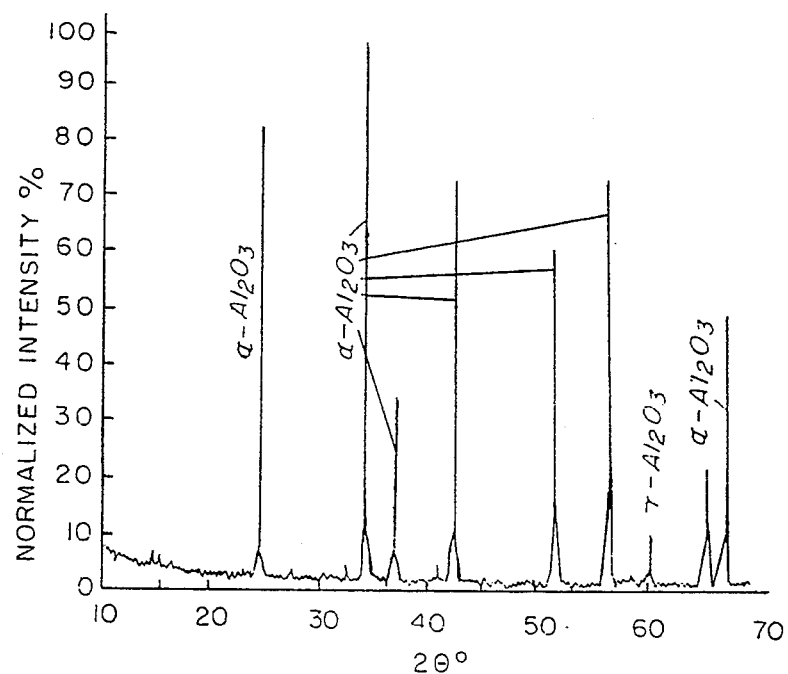

LASER PROCESSED COATINGS ON ELECTRONIC CIRCUIT SUBSTRATES

FIELD OF INVENTION

The present invention relates to techniques for producing integrating electronic substrates and circuit panels useful in high power circuit applications and for high power circuit operations in elevated temperature environments. In the art of manufacture of monolayer or multilayer circuit boards, or panels which may utilize metal heat-sinks, ceramic materials and metal circuit patterns in a layered combination, the objects are to realize arrangements that provide the characteristics necessary for rapid and uniform heat dissipation at elevated temperature, high dielectric properties, and excellent bond development between the metal and ceramic components.

BACKGROUND OF THE INVENTION

In the prior art, thin ceramic layers or coatings have been bonded to, or coated/deposited on metal substrates for support of the ceramic and as a means for dissipating heat generated by circuit components mounted thereon. However, such prior art arrangements have not provided the desired results. Traditionally, alumina (the hexagonal structure of $Al_2O_3$) has been used with such metals as copper, aluminum, etc. because of the extensive knowledge and data available regarding these materials. Prior art devices using these materials have proven undesirable because of poor bond development between the alumina and the various metals used. In addition these materials in combination have been found to be incompatible with elevated temperature operations and are plagued by low dielectric properties and debonding when used at high power levels. More recently, efforts have been directed toward the use of ceramics thermal/plasma spray deposited on metal substrates. However, these efforts also have not been found to be satisfactory owing to inherent thermal and dielectric properties of the ceramics utilized. There appears to be a lack of readily available data and understanding concerning surface condition or treatment thereof to solve these long standing problems of the prior art. For example, there is disclosed in Sarin et al (U.S. pat. Ser. No. 4,406,668) and Komatsu et al (U.S. pat. Ser. No. 4,761,339) techniques for surface treatment of metals with ceramics for the purpose of providing ceramic coatings therefor that are resistant to oxidation at elevated temperatures, while Surisowa et al (U.S. pat. Ser. No. 4,539,251) is concerned with ceramic materials applied to the surface of metal tools used in cutting tools and other wear resistant tools which are subjected to elevated temperatures. None of these references address the problems of thermal conductivity, dielectric breakdown or other electrical characteristics of the ceramic in combination with the attendant metal substrates for purely electrical circuitry.

Other bonding techniques for electrical applications, i.e., the metallization of alumina and beryllia electronics substrates employ eutectic bonding of an oxidized copper foil surface to the ceramic at temperatures, e.g. 1065° C., where the copper oxide is amorphous and bonds to the ceramic (See "Electronic Packaging Materials Science" Materials Research Society Symposia Proceedings, Vol. 40, Ed. E. A. Giess et al, p. 393, M. Wittmer, "Eutectic Bond of Copper to Ceramic"). Another prior art technique is to attach a metal heat sink to alumina by dip brazing or soldering using such materials as $MoO_3$-$MnO$ or Ti-Cu (see M. Wittmer & Y. Kuromitsu, et al, ISHM 1990, p.19.).

In contrast to the prior art and in accordance with the techniques of the present invention, it has been discovered after extensive and costly investigation and experimentation that certain ceramics may be deposited as a layer on a metal support substrate by means of plasma spray with excellent bonding therebetween (bond-development) which may be further enhanced when the surface of such ceramic is laser-reflowed and then rapidly cooled for resolidification and recrystallization. As can readily be appreciated from the foregoing discussion of the prior art problems, it is desirable to find a method and ceramic materials by which a thin layer or coating of ceramic can readily be adapted for combination with metal substrates which will have the electrical and thermal properties, including good thermal conductivity, increased dielectric strength, and enhanced bond-development for high power and elevated temperature operation.

BRIEF SUMMARY OF THE INVENTION

In accordance with the teachings of the present invention, it has been discovered that commercially available ceramic, such as alumina ($Al_2O_3$), can be plasma sprayed in a thin layer, on the order of 0.013 cm thick for example, onto a metal substrate, such as copper alloy, on the order of 0.318 cm thick, where the alumina layer is exposed to a moving focused laser beam causing an area of the alumina layer exposed to the laser beam to become molten. As the laser beam sweeps along the surface of the alumina a reflow path of alumina develops in the area of immediate contact between the laser beam and the alumina layer. The reflowed ceramic area is instantaneously cooled (rapid solidification), resolidified and recrystallized as the laser beam sweeps forward. The resulting recrystallized ceramic structure may be characterized as having a smooth planarized outer surface, a density on the order of 3.95 g/cc or more, a volume resistivity on the order of $10^{14}$ ohm-cm or more (up from $10^9$ ohm-cm), a dielectric constant below 300 Megahertz (MHz) of 10.6 in the $\alpha$-axis and 8.6 in the direction perpendicular to the $\alpha$-axis, devoid of substantially all impurities (especially $CuAl_2O_4$, $CuAlO_2$, and $Na_2O$) and an $\alpha$-alumina crystalline structure of corundum having a near single crystalline structure and some amorphous structure, and a thermal conductivity on the order of 40 W/m-K for 99.9% plus dense $\alpha$ alumina up from about 12 W/m-K for commercial $Al_2O_3$ (96% dense).

BRIEF DESCRIPTION OF DRAWINGS

The invention can be described in more detail with the aid of the accompanying drawings wherein:

FIG. 1 shows an arrangement for practicing the invention, wherein a laser beam is wedge focused to spread the beam thereof which impinges on a thin layer of ceramic deposited on a metal substrate;

FIG. 2 shows an arrangement for laser-etching a metal coating or for conversion of another ceramic deposited on a layer of ceramic for forming circuit components and interconnecting conductor patterns;

FIG. 3 is a graphic plot of X-ray analysis of as-received alumina ceramic powder as-received from manufacturers;

DETAILED DESCRIPTION OF THE INVENTION

Figure 4:
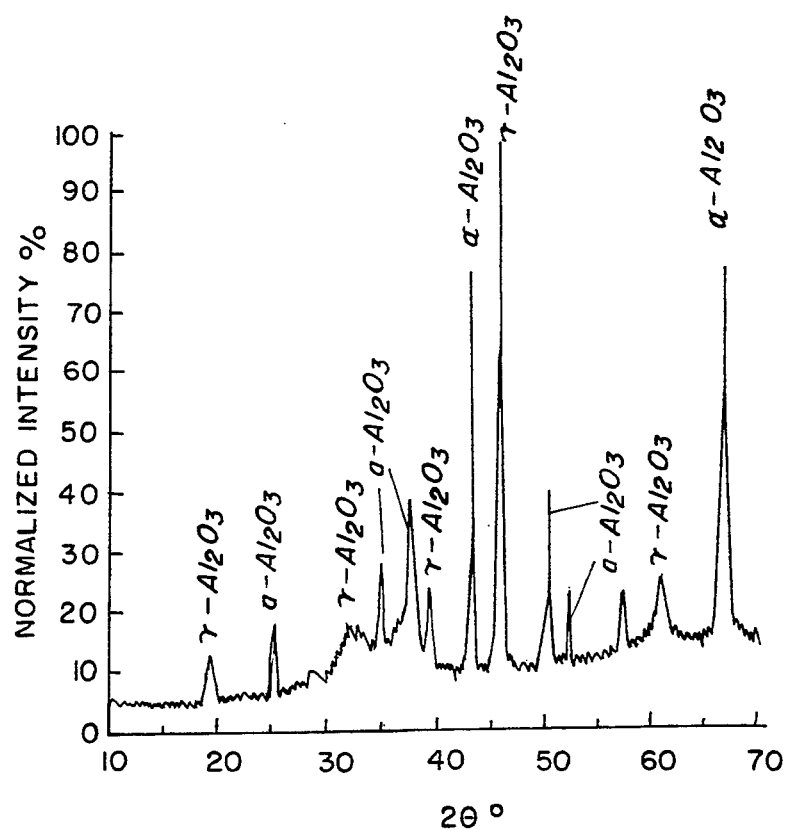
FIG. 4 is a graphic plot of X-ray analysis of the α-alumina ceramic material which was plasma sprayed on metal substrates in thin layers.

Referring now to the drawings, there is shown in FIG. 1 a laser 10, a beam spreader 12, a widened laser beam 14, shown impinging upon a thin layer of α-alumina ceramic 16, deposited on a metal substrate 18. Focus lens 12 can be moved to direct a laser beam 14 across the ceramic layer 16 in a sweeping motion providing focused thermal energy thereon to cause the ceramic 16 to become a moving molten medium as the beam 14 sweeps along a preselected path. Conversely, the path of the molten ceramic segment can be created by holding the impinging laser beam 14 stationary while moving substrate 18.

As depicted in FIG. 1, laser beam 14 may be increased in width on the order of 2.5 cm whereas the normal beam width used may be on the order of 0.320 cm. Use of the wider beam, nearly 8 times as wide, reduces substantially the need to raster or sweep the beam in order to reflow preselected surface areas. Typically the laser-reflowed ceramic may be accomplished by using a Photon V1200 $CO_2$ laser, for example, with continuous wave (CW) power greater than 250 watts and a raster speed greater than 1.5 cm/s. The temperature at the point of contact between the laser-reflow beam and alumina is between 2055° C., where $Al_2O_3$ melts, and 2595° C., where copper vaporizes.

Continuing with the description of FIG. 1, the ratio of ceramic-to-metal substrate may be on the order of 1:25, for a typical effective combination as an electronic high power heatsink; however, this ratio is not intended as a limitation. The process for coating metal substrate 18 commences by grit blasting it on both sides, with suitable alumina having 10 to 60 micron agglomerate particles at 60 psi pressure. Both sides of substrate 18 are grit blasted in order to cancel residual stress effects. The α-alumina ceramic particles having a diameter in the range of 15–40 microns were plasma sprayed onto a planar surface thereof by means of a General Plasma (HDP) system. Flame temperatures was on the order of 3090° C. and particle velocities were from 90 to 900 m/s are typical for oxygen fuel systems. Generally a fluidized bed feeder may be used; however, for particle sizes less than 10 micron mean particle diameter, a Sulzer type feed system may be necessary for best spray results. Other forms of HDP spray are useful; however, the General Plasma Spray system utilized was equipped with a programmable computer controlled device for providing uniform coating thickness over the entire surface of the metal substrate, and thus was the system of choice for the present case. It should also be noted that the General Plasma system provided the means for accurate and precise rates of deposition for thick layer control.

The next step in the process of the invention is the laser-reflow process which is considered critical to successful preparation of the thin layer of ceramic deposited on the metal substrate. As discussed above ceramic layer 16 is impinged by laser beam 14 or a narrower beam in a scanning, rastering, or sweeping motion to thereby cause further densification, impurities purging or purification, surface sealing, and planarization (smoothing) of layer 16. The foregoing similar types of results were obtainable by the use of several different focused thermal energy sources, namely, a Nd:YAG laser with continuous wave (CW) power greater than 32 watts, or Q-switched at 10 Kilohertz (MHz), having a beam diameter on the order of 0.025 cm, and scan speeds of 0.4 to 10 cm/s; a $CO_2$ laser with greater than 250 watts CW having a beam diameter on the order of 0.32 cm and scan rates of 1 to 3 cm/s; a XeCl excimer laser operated at energy densities greater than 25 $J/cm^2$ and pulse repetition rates on the order of or greater than 10 Kilohertz (KHz) having beam dimensions on the order of 1 cm × 2 cm; and high intensity arc-lamps, of greater than 150 kilowatts, with a maximum intensity of 1 $Kw/cm^2$ having an emission spectrum between 200 to 1400 nm, scanning of ceramic layer 16 is accomplished by continuous exposure.

In each of the cases noted rapid cooling, resolidification, and recrystallization occurs in an air atmosphere. In certain instances it may be necessary to speed up the cooling process by the use of a suitable cooling system such as air or other gas jet, subsequent to ceramic reflow, which may depend upon thickness of the ceramic, depth of penetration, and the thicknesses of the metal substrate utilized. It is important to note that the properties of the restructured ceramic layer or surface are allied with the reflow cycle that is of a duration necessary to cause vaporization, sublimation, and purging of unwanted chemicals or compounds, and rapid solidification of the reflowed surface so as to inhibit and eliminate the reformation or existent unwanted voids, crystalline fractures or elements, or other crystalline defects in the structures.

When the foregoing laser-reflow process has been completed as contemplated herein, the ceramic layer has been purged and recrystallized in the α-alumina structure (hexagonal/rhombohedral) of corundum having a near single crystalline structure and some amorphous structure whose density is 3.95 g/cc or more, a volume resistivity on the order of $10^{14}$ ohm-cm, a dielectric constant below 300 Megahertz (MHz) of 10.6 in the c-axis and 8.6 in the direction perpendicular to the c-axis, and devoid of impurities, especially $CuAl_2O_4$, $CuAlO_2$, and $Na_2O$, when copper or alloys thereof are used as the metal substrate. It has been observed in experimental applications that metal support integrating substrates with a reprocessed ceramic layer deposited thereon in accordance with the present invention are readily adapted to dissipating loads of 10–50 watts/$cm^2$ for high density mounted electronic circuit components, such as electronic chips, rectifier devices, high current carrying interconnection etc. As high power integrating circuit heat-sinks these ceramic layered devices are adaptable for operation at elevated temperature on the order of 165° C. or more in unprotected areas of automotive and aerospace applications. They may also be adapted for use of liquid cooling techniques with the traditional mechanical stresses associated with such uses. It should be noted that the laser-reflow process provides another unexpected result, namely that of enhancing the bond-development between the ceramic layer and the metal substrate. It has been observed that while the plasma spray technique propels near or molten sprayed particles onto the substrate, they do not all attach thereto with the same bonding properties. Whereas when the deposited layer is reflowed more uniform and controlled heat is applied and cooling is more uniform to thereby cause more tenacious and uniform bonding of the entire reflowed surfaces. In addition, the interface between the bodies becomes more homogeneous and devoid of voids, stress fractures, impurities, etc.

As examples of this embodiment of the invention two pieces of C11000 copper alloy 12.7 cm×12.7 cm×0.16 cm and 12.7 cm× 12.7 cm×0.32 cm, supplied by Olin Brass, were each coated with a layer of α-alumina by the process described herein above with the General Plasma HDP system. The α-alumina ceramic powder was supplied by Micro-Abrasives Industries and the powder agglomerates has a mean diameter in the range of 15–40 micron. C11000 copper alloy and other alloys having a thermal conductivity 50% or greater than that of pure copper are preferred for heat sinks. Other metal alloys such as aluminum 6101 and stainless steels, and composite systems such as silicon carbide filament or fiber reinforced aluminum may be utilized as heat sink substrate materials on which ceramic layers may be deposited and processed with the same enhanced properties discussed as well as excellent bond-development which occurs pursuant to the teachings of the invention.

In this example the α-alumina ceramic was deposited in a uniform 0.013 cm thick layer using a ceramic material from Micro-Abrasives Industries.

Referring to FIG. 3 there is shown the X-ray analysis plot of the as received α-alumina powder from Micro-Abrasive. FIG. 4 is an X-ray analysis plot of the same materials as above which was sprayed by the General Plasma HDP system onto C11000 copper alloy substrates, illustrating the primary and secondary peaks for the various phases, i.e., α (hexagonal/rhombohedral) and γ (cubic) phases observed. It can be readily be seen from the plot that the HDP plasma spray process caused some conversion of materials wherein there are noticeable increases in the γ spectrum phase.

Figure 5:
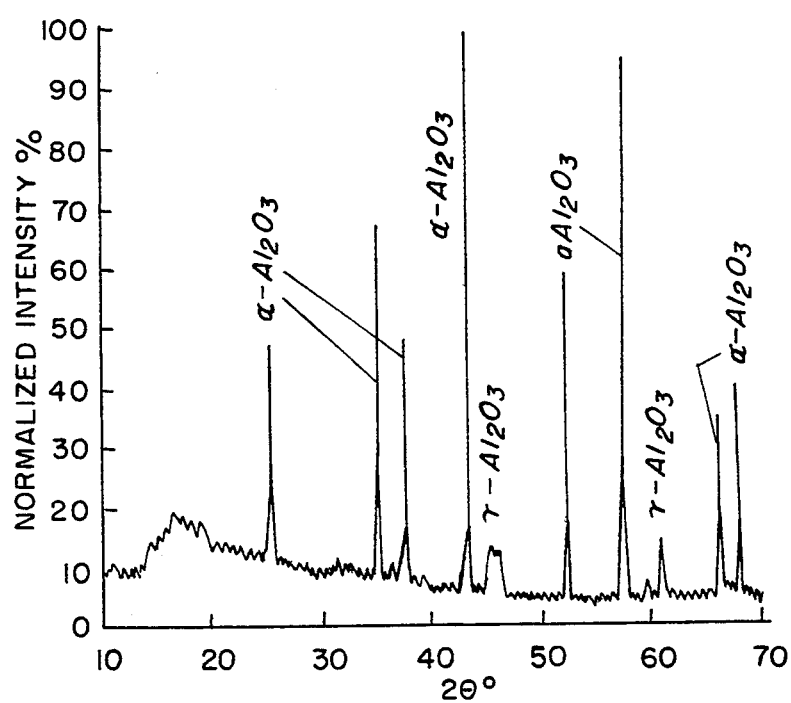
FIG. 5 is a graphic plot of X-ray analysis of the laser-reflowed α-alumina ceramic layer material shown in FIG. 4, illustrating the conversion and recrystallized structure resulting therefrom.

Referring now to FIG. 5, there is shown a plot of the Micro-Abrasive coated substrate in which alumina coating layer 16 has been laser-reflowed and rapidly resolidified and recrystallized as described herein above. As shown in the plot only the α-alumina ceramic primary and secondary peaks appear above the two γ spikes which are well below the background level (i.e, 20% normalized intensity) of the plot.

The Micro-Abrasives α-alumina deposited on layer 16 was laser-reflowed using the Photon Model V 1200 $CO_2$ laser as discussed herein above; where melting of the alumina ceramic 16 occurred at 2045° C. or more and was rapidly recrystallized, causing the transformation noted, thereafter.

The X-ray characterization measurements and analysis was performed on a Rigaku X-ray diffractometer. This diffractometer was supplemented by a DMAX computer program for data collection and analysis. The background radiation level was not eliminated during the samples analyses.

Another advantage of the present invention involves forming miniature recesses or cavities 19 show in FIG. 1 in a planar surface of metal substrate 18 contiguous therewith to receive circuit chips or components, etc. After formation such recesses or cavities may be coated along with the planar surfaces of the substrate 18 and laser-reflowed as taught herein to produce an arrangement adaptable for multilayered circuit modules having excellent thermal dissipation and dielectric properties as discussed herein. In the alternative a solid planar α-aluminum substrate, may have such recesses or cavities formed therein and entire planar surface and the surfaces of such cavities laser reflowed in accordance with the teachings of the invention to produce substrates of ceramic which can be stacked to provide multilayer electronic modules containing microelectronic circuits, interconnections, and other electrical components therein. Such multilayer modular applications would solve numerous prior art problems associated with the inability of such configurations to avoid dielectric breakdown at elevated temperature uses and to overcome the heat dissipation problems also present in the prior art devices.

Another example of the utility of these improved ceramic layers is demonstrated by the use of similar processed substrates for use as infrared heating panels. Non-focused infrared panel emitters are used in ovens for processing and mass soldering of electronic surface mounted printed circuit boards. The prior art details of the technology may be discerned by reference to U.S. pat. Ser. Nos. 4,602,238; 4,565,917; 4,659,906, assigned to Vitronics Corporation, Newmarket N.H. and U.S. pat. Ser. No. 4,542,268 for a browning heater for a microwave oven, of Litton Industries.

For example a layer of alumina ceramic was sandwiched between a 304L stainless steel (SS) support substrate and thin coating of Nichrome ®. The 0.16 cm thick 304L SS substrate was coated on one planar surface with commercially available alumina by HDP plasma spray 0.017 cm thick and subsequently laser-reflowed. Both processes were performed as disclosed herein above with respect to preparation of high power heat-sinks. To complete the sandwich arrangement a thin coating of Nichrome ®, on the order of 0.01 cm thick, was plasma spray deposited on top of the laser-reflowed alumina ceramic layer.

Referring to FIG. 2, there is depicted a laser 20, a laser focus lens 22 for deflecting a beam 32 of laser 20 which impinges on a thin Nichrome ® coating 28 that is deposited by HDP plasma spray on top of an underlying thin alumina ceramic layer 24, which has been laser reflowed, which is in turn applied to an underlying 304L SS support substrate. As shown a laser etched resistance heating element 30, laid out in a serpentine circuit pattern is formed while having no adverse effects on the underlying ceramic layer. In operation, a suitable electrical power source is connected to the resistance heating element 30 for applying suitable voltage and current.

The resulting heater panel was electrically tested and analyzed at temperatures greater than 400° C. for extended periods during multiple recycles, and showed no signs of debonding or degradation of the applied coatings. The electrical resistance of element 30 formed on top of ceramic layer 28 had a resistance value on the order of 60 ohms and drew a current of 3.0 amps at 220 volts, indicating low energy usage. However, the panel was tested at higher temperature on the order of 1100–1200° C., without incident of degradation and debonding. Thermal tests at about 400° C. were of concern since it is understood to be near the operating range of typical infrared reflow oven systems.

The plasma spray deposition was performed in a chamber under positive forming gas (4% hydrogen-90% Nitrogen) in order to maximize electrical conductivity of the metal layer, i.e., Nichrome ®, copper alloys etc., by preventing oxidation. A Nd:YAG laser with a beam diameter of 0.025 cm and emission wavelength of 1064 nm was used to irradiate Nichrome ®️ coating 28 during laser etching/patterning process.

Also shown in FIG. 2 is a thermal sensor (thermocouple) 34, consisting of two dissimilar ceramic strips 36 and 38, overlapping each other in an area designated 40, The open terminal end of the first strip 36 is designated 42 and open terminal end of second strip 38 is designated 44. The first strip 36 is aluminum nitride (AlN) and second strip 38 is silicon carbide (SiC) both of which deposited on ceramic layer 16 by well known masking techniques, overlapping at one of the respective ends. The overlap area 40 on the order of 0.010 in. in diameter was fused by Nd:YAG laser beam 32 to form an electromotive force junction of the two dissimilar ceramics in the area where they overlap. The laser processing of the AlN and SiC ceramic strips, respectively 36 and 38, were processed in accordance with the teaching of applicant's U.S. pat. Ser. No. 5,145,741, issued Sep. 8, 1992, entitled "CONVERTING CERAMIC MATERIALS TO ELECTRICAL CONDUCTORS AND SEMICONDUCTORS." These ceramics are sprayed in inert or partially reducing atmospheres on the ceramic underlayer so as to avoid any change in these ceramics prior to their laser processing in accordance with U.S. pat. Ser. No. 5,145,741. It should be noted that these ceramics can he used singularly, e.g., a single strip of AlN or SiC, as a thermal sensor to monitor temperature by resistance change in these materials after their laser conversion to electroconductors. Insulative structures of these ceramics can he applied as the underlayer eliminating the need for plasma spray coating strips of these ceramics and facilitating laser conversion in accordance with U.S. Pat. No. 5,145,741.

In the alternative, the first and second strips 36 and 38, may be respectively chromel and alumel metals. When metals such as chromel and alumel are utilized to produce the thermocouple, they are laser etched to produce resistance elements therefor.

The thermal sensor or thermocouple formed is useful as a means for monitoring the temperature of the arrangement. It should be noted that the use of such a thermocouple device may be disposed in as many locations as desired on the arrangement FIG. 2, simply by first depositing a small area of ceramic and then plasma spray applying two strips of dissimilar ceramic, laser convertible to a conductor or semiconductor, or metal which overlap in a common area which are laser fused to form an electromotive force junction. An appropriate potentiometer, resistance meter, or temperature display system may be connected between their respective open terminal ends for purposes of observing or monitoring temperature at selected points of interest.

At this juncture of the disclosure it is noteworthy to observe and emphasize certain unique features of the invention, namely, that the use of recesses or cavities in a multilayered modules (three-dimensional configurations) enables the circuit chips, devices, etc. to be completely enclosed in an excellent high dielectric and uniform heat dissipation environment; and provides an environment within the module for elimination of current and voltage leakages and breakdowns therein, and reduces, if not eliminates "frequency cross-talk" between passive and active electronic devices and components.

Another noteworthy factor arises from the fact that the thickness of the laser-reflowed ceramic appears limitless owing to the fact that numerous layers of the laser-reflowed ceramic may be utilized to produce the thicknesses thereof.

The foregoing disclosure and teachings of the present invention readily and adequately demonstrate that processing thin layers and surfaces of ceramic materials, especially alumina which has been the material of choice for electronic circuit design, represent readily adaptable techniques and products for solving long standing problems in the prior art with regard to dielectric and thermal properties of ceramics utilized for integrating circuitry for high power and elevated temperatures applications. The teachings of the invention are clearly applicable for use to produce high power module heat sinks for high density circuit boards that require high thermal dissipation capabilities in automotive and aerospace vehicles; heating panel applications including infrared panels; thermocouples and thermal sensors; multilayer electronic circuit modules; etc.

It is to be understood that the above described embodiments are only illustrative of the principles applicable to the invention. Various other arrangements and modifications may be defined by those skilled in the art without departing from the spirit and scope of the invention. For example, if an excimer laser, or other focused thermal energy sources such as tungsten arc lamps or electron beam sources may be adapted to have similar or equivalent processing characteristics or parameters of the lasers disclosed, it is inferred that similar thermal and dielectric properties are attainable within the scope of the invention. Consequently, it is understood that the present invention is limited only by the spirit and scope of the disclosure and appended claims.

What is claimed as new is:

1. A bilayer substrate as a support and heat-sink for mounting high-power and high density integrating electronics and electrical circuit components and devices adapted for electrical high power electronic applications, said substrate having a surface of high dielectric constant and rapid thermal conductivity/dissipation properties as a bilayer substrate component, the combination, comprising:
   (a) an electro-conductive support substrate having a planar surface; and
   (b) a layer of insulative ceramic of $Al_2O_3$ material deposited onto said support planar surface as a reflowed and recrystallized layer having enhanced properties of thermal conductivity, density per unit volume, dielectric strength and bond development between said support substrate and layer of ceramic material, said reflowed and recrystallized $Al_2O_3$ layer of ceramic is an $\alpha$-alumina structure (hexagonal rhombohedral) of near single crystalline corundum.

2. A bilayer substrate of claim 1, in which said layer of insulative ceramic has a dielectric constant of approximately 10.6 below 300 Megahertz, density of approximately 3.98 grams per cubic centimeter, a volume resistivity of approximately $10^{14}$ ohm-cm and a thermal conductivity of approximately 40 watts/m-K.

3. A bilayer substrate of claim 1, in which said substrate is capable of dissipating approximately 50 watts of electrical power per square centimeter.

4. A bilayer substrate of claim 3, in which said insulative ceramic layer and support substrate have a thickness ratio therebetween of approximately 1:25, said support substrate is between 0.16–0.32 cm thick.

5. A bilayer substrate of claim 1, in which said support substrate has at least one cavity having surfaces formed therein contiguous to said planar surface adapted for receipt and support of an electronic circuit device disposed therein and wherein said cavity surface are coated with said ceramic layer that are reflowed and recrystallized along with said planar surfaces of said substrate.

6. A bilayer substrate of claim 1, in which said heat-sink support material is selected from the group consisting of copper and alloys thereof, aluminum and alloys thereof, stainless steel and composite system of silicon carbide filament or fiber reinforced aluminum.

7. A bilayer substrate of claim 6, in which said heat-sink support has a thermal conductivity greater than 50% of that of copper.

8. A substrate having an insulative surface containing at least one insitu voltage detecting thermocouple disposed on said surface, the combination comprising:
(a) a surface of a substrate adapted for having at least two strips of electro-conductive ceramic material deposited and formed thereon; and
(b) a voltage detecting thermocouple deposited and formed on said surface of said substrate, comprising a first and second narrow strip of ceramic converted to electro-conductive ceramic materials on said surface, each of said electro-conductive ceramic strips having a different electrical resistance, and each having two ends with one end of each strip being overlapped and fused with one another to form a voltage detecting thermocouple junction where said strip ends are overlapped and fused together, and said other ends thereof function as open electrical terminal ends available as electrical contacts for measuring a voltage developed at said thermocouple junction.

9. A substrate structure of claim 8, in which said first and second narrow strips of ceramic material are aluminum nitride (AlN) and Silicon Carbide (SiC) respectively for producing electro-conductive ceramic strips of said voltage detecting thermocouple.

10. A substrate of claim 8, in which said electro-conductive ceramic materials are both of non-hexagonal crystalline structure of different electrical resistances.

11. A multilayer substrate as a heater device having an electrical insulative layer of high dielectric constant and rapid thermal conductivity/dissipation properties and enhanced bond development sandwiched between a metal support substrate and a metal high resistance circuit pattern, the combination comprising:
(a) a metal support having a surface;
(b) a layer of ceramic of $Al_2O_3$ material deposited onto said metal support surface as a reflowed and recrystallized layer having enhanced properties of thermal conductivity, density per unit volume, dielectric strength and bond development between said support substrate and layer of ceramic material; and
(c) an electrical high resistance material layer plasma spray deposited and bonded to said reflowed and recrystallized layer of ceramic, said resistance layer having an electrical heater pattern defined and scribed therein.

12. A multilayer substrate as a heater device of claim 11, in which said electrical heater pattern is defined and formed by means of laser scribing.

13. A multilayer substrate as a heater device of claim 12, in which said electrical resistance metal is Nichrome and metal support is stainless steel.

14. A multilayer substrate as a heater device of claim 12, in which said insulative layer is substantially purged of impurities of oxides selected from the group consisting of $CuAl_2O_4$, $CuAlO_2$ and $Na_2O$.

15. A multilayer substrate as as a heater device of claim 12, in which sad insulative layer is substantially devoid of oxides of said supporting substrate.

16. A multilayer substrate as a heater device of claim 12, in which an interface between said support substrate and insulative layer is devoid of voids, stress fractures and impurities to thereby provide a substantially homogeneous interface therebetween.

* * * * *